(12) United States Patent
Hong

(10) Patent No.: US 8,049,265 B2
(45) Date of Patent: Nov. 1, 2011

(54) SEMICONDUCTOR DEVICE AND METHOD OF FABRICATING THE SAME

(75) Inventor: Ji Ho Hong, Hwaseong-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 398 days.

(21) Appl. No.: 12/325,082

(22) Filed: Nov. 28, 2008

(65) Prior Publication Data
US 2009/0294826 A1 Dec. 3, 2009

(30) Foreign Application Priority Data
Dec. 3, 2007 (KR) .................. 10-2007-0124304

(51) Int. Cl.
*H01L 29/788* (2006.01)
(52) U.S. Cl. .................. 257/315; 257/E21.209
(58) Field of Classification Search ............. 257/314, 257/315, E21.442, E21.209
See application file for complete search history.

(56) References Cited

U.S. PATENT DOCUMENTS

| | | | | |
|---|---|---|---|---|
| 5,707,884 | A * | 1/1998 | Fontana et al. | 438/258 |
| 5,872,035 | A | 2/1999 | Kim et al. | |
| 5,908,311 | A | 6/1999 | Chi et al. | |
| 6,841,487 | B2 * | 1/2005 | Yuzuriha et al. | 438/725 |
| 6,853,028 | B2 | 2/2005 | Kim et al. | |
| 7,786,524 | B2 * | 8/2010 | Hazama | 257/316 |
| 2004/0041202 | A1 | 3/2004 | Kim et al. | |
| 2004/0173870 | A1 * | 9/2004 | Sato et al. | 257/510 |
| 2007/0211510 | A1 * | 9/2007 | Madan et al. | 365/65 |

FOREIGN PATENT DOCUMENTS

| | | |
|---|---|---|
| CN | 1170959 A | 1/1998 |
| KR | 10-0448911 B1 | 9/2004 |
| KR | 10-0486309 B1 | 4/2005 |

OTHER PUBLICATIONS

Stanley Wolf, "Silicon Processing for the VLSI ERA", 2000, Lattice Press, second edition, vol. 1, pp. 524-526.*
Jin U. Kim, Yong Hui Kim and Cheol Sun Kwon; "Nonvolatile Memory Device with Dummy Pattern"; Korean Patent Abstracts; Publication No. 1020040021772 A (corresponding to Korean Patent No. KR 10-0448911); Publication Date: Nov. 3, 2004; Korean Intellectual Property Office, Republic of Korea.
Korean Office Action dated Apr. 17, 2009; Korean Patent Application No. 10-2007-0124304; Korean Intellectual Property Office, Republic of Korea.
Kim Myung-Seon and Back Sun-Haeng; Method of Forming Floating Gate in Flash Memory Device; espacenet; Chinese Publication No. CN1170959 (A); Publication Date: Jan. 21, 1998; espacenet Database—Worldwide, http://v3.espacenet.com/publicationDetails/biblio?DB=EPODOC&adjacent=true&locale=....

(Continued)

*Primary Examiner* — Jerome Jackson, Jr.
*Assistant Examiner* — Paul Budd
(74) *Attorney, Agent, or Firm* — The Law Offices of Andrew D. Fortney; Andrew D. Fortney

(57) ABSTRACT

Provided are semiconductor devices and methods of fabricating the same. The semiconductor device comprises: a floating gate pattern formed in a cell area of a semiconductor substrate; a dummy floating gate pattern extending from the floating gate pattern into an interface area around the cell area; and a control gate pattern intersecting the floating gate pattern at the cell area of the semiconductor substrate.

20 Claims, 6 Drawing Sheets

OTHER PUBLICATIONS

Sun Young Kim; "Method of Manufacturing Flash Memory Device Using Hard Mask Instead of Photoresist Pattern as Etching Mask for Improving Gate Profile and CD Distribution within Peripheral Region"; Korean Patent Abstracts; Publication No. 1020050022624 A; Publication Date: Aug. 3, 2005; Korean Intellectual Property Office, Republic of Korea.

Korean Office Action dated Oct. 22, 2008; Korean Patent Application No. 10-2007-0124304, filed Dec. 3, 2007; Korean Intellectual Property Office, Republic of Korea.

* cited by examiner

SEMICONDUCTOR DEVICE AND METHOD OF FABRICATING THE SAME

CROSS-REFERENCE TO RELATED APPLICATIONS

The present application claims priority under 35 U.S.C. 119 and 35 U.S.C. 365 to Korean Patent Application No. 10-2007-0124304 (filed on Dec. 3, 2007), which is hereby incorporated by reference in its entirety.

BACKGROUND

In general, flash memory has been developed to achieve the advantages of both a related art erasable programmable read only memory (EPROM) and a related art electrically erasable PROM (EEPROM). The flash memory is capable of electrically programming and erasing data, and its manufacturing unit costs are relatively low because of its simple manufacturing processes and miniaturized chip size.

Additionally, the flash memory has characteristics of a random access memory (RAM) in that the flash memory is a non-volatile memory, retaining its stored data even when there is no power supply, and is also capable of electrically programming and erasing information in a system. Therefore, the flash memory is often used as a memory device replacing a memory card or a hard disk of portable electronic devices.

In this flash memory, the programming of data may be performed by injecting hot electrons. That is, if hot electrons occur in a channel by an electric potential difference between a source and a drain, hot electrons having an energy of more than 3.1 eV (i.e., an electric potential barrier between polycrystalline silicon and an oxide layer constituting a control gate) are transferred into and stored in a floating gate due to a high electric field of a control gate.

Hot electron generation is unavoidable in certain flash memory devices that are designed to generate these hot electrons. However, because hot electrons may deteriorate the related art metal oxide silicon (MOS) device, the device needs to be designed to suppress device deterioration, if possible.

In this flash memory, a critical dimension (CD) of a gate is a very important factor in determining device characteristics during the forming of a gate pattern.

Usually, in order to form the gate pattern, a polysilicon layer is formed on a semiconductor substrate, and an anti-reflection layer and a photoresist pattern are formed on the polysilicon layer. Then, the anti-reflection layer and the polysilicon layer are patterned by using the photoresist pattern as a mask.

FIG. 1 is a cross-sectional view illustrating a part of semiconductor device manufacturing processes.

A semiconductor substrate 10 includes a cell area CA, a peripheral area PA around the cell area CA, and an interface area IA between the cell area CA and the peripheral area PA.

A device isolation layer pattern 11 is formed in the semiconductor substrate 10 to define an active area where devices are to be formed.

A flash memory device is formed in the cell area CA. A floating gate 13 is formed on the semiconductor substrate 10, and a polysilicon layer 15 for a control gate is formed on the floating gate 13.

A hard mask layer 17, an anti-reflection layer 19, and a photoresist pattern 20 are sequentially stacked on the polysilicon layer 15 in order to form a control gate by patterning the polysilicon layer 15 using the photoresist pattern 20 as a mask.

However, because the floating gate 13 is formed only in the cell area CA, there is a height difference between the cell area and the interface area. Thus, a thinning phenomenon occurs, in which the anti-reflection layer 19 becomes thinner as it approaches from the center to the edge in the cell area CA.

The light reflectivity of the anti-reflection layer 19 is affected by the thinning phenomenon, and varies at the edge of the cell area (due to the thickness change of the anti-reflection layer 19) during a photolithography process to pattern the polysilicon layer 15 to form a control gate. Therefore, the CD of the photoresist pattern 20 is reduced.

If the CD of the photoresist pattern 20 is reduced, the photoresist pattern 20 may collapse, and a defective memory device may be formed, or it may prevent uniform adjustment of the CD of the control gate. These limitations affect wafer yield directly and substantially, and may also deteriorate device reliability.

SUMMARY

Embodiments provide a semiconductor device capable of obtaining a desired or predetermined process margin by preventing a thinning phenomenon of an anti-reflection layer during a photolithography process for forming a control gate, and a method of fabricating the same.

In one embodiment, a semiconductor device comprises: a floating gate pattern in a cell area of a semiconductor substrate; a dummy floating gate pattern extending from the floating gate pattern to an interface area around the cell area; and a control gate pattern intersecting the floating gate pattern at the cell area of the semiconductor substrate.

In another embodiment, a method of fabricating a semiconductor device comprises: forming a floating gate pattern and a dummy floating gate pattern, the floating gate pattern being in a cell area of a semiconductor substrate, the dummy floating gate pattern extending from the floating gate pattern to an interface area around the cell area; and forming a control gate pattern in the cell area of the semiconductor substrate, the control gate pattern intersecting the floating gate pattern.

In another embodiment, a semiconductor device comprises: floating gate patterns elongated in a first direction in a cell area of a semiconductor substrate; a control gate pattern intersecting the floating gate patterns in the cell area of the semiconductor substrate in a second direction perpendicular to the first direction; and a dummy floating gate pattern on the interface area around the cell area in the second direction and spaced apart from one end of the floating gate pattern.

In another embodiment, a method of manufacturing a semiconductor device comprises: forming floating gate patterns and dummy floating gate patterns, the floating gate patterns being in a cell area of a semiconductor substrate, the dummy floating gate patterns being spaced apart in a direction perpendicular to a length direction of the floating gate patterns in an interface area around the cell area; and forming a control gate pattern in the cell area of the semiconductor substrate, the control gate patterns intersecting the floating gate patterns.

According to an embodiment, a thinning phenomenon is prevented in the presently disclosed devices by extending the floating gate to an interface area, or forming a separate dummy gate pattern during photolithography (e.g., for control gate formation). Therefore, a process margin that is obtained in the photolithography process is such that device yield is increased and the fraction of defective devices formed on a wafer or chip is reduced.

According to another embodiment, because the CD of the control gate is uniform during semiconductor device manufacturing processes, device performance can be improved.

The details of one or more embodiments are set forth in the accompanying drawings and the description below. Other features will be apparent from the description and drawings, and from the claims.

DETAILED DESCRIPTION OF THE EMBODIMENTS

Figure 1:
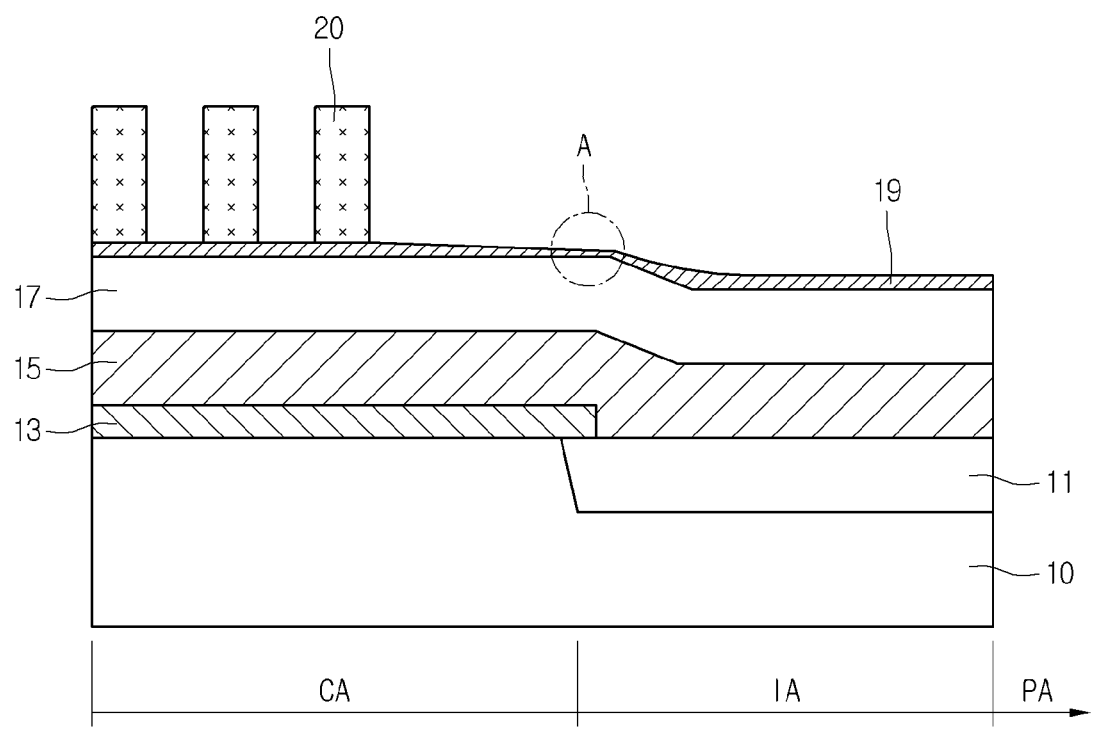
FIG. 1 is a cross-sectional view illustrating a part of a related art semiconductor device manufacturing processes.

Hereinafter, a method of fabricating a semiconductor device according to embodiments will now be described in detail with reference to the accompanying drawings. Hereinafter, members are selectively or interchangeably used for each other. In the figures, a dimension of each of elements is exaggerated for clarity of illustration, and the dimension of each of the elements may be different from an actual dimension of each of the elements. Not all elements illustrated in the drawings must be included and limited to the present disclosure, but the elements except for essential features of the present disclosure may be added or deleted. In the description of embodiments, it will be understood that when a layer (or film), region, pattern, or structure is referred to as being 'on/above/over' another substrate, layer (or film), region, pad, or pattern, it can be directly on the another substrate, layer (or film), region, pad, or pattern, or an intervening layer (or film), region, pad, pattern, or structure may also be present. Further, it will be understood that when a layer (or film), region, pattern, or structure is referred to as being 'down/below/under' another substrate, layer (or film), region, pad, or pattern, it can be directly under the another substrate, layer (or film), region, pad, or pattern, or an intervening layer (or film), region, pad, pattern, or structure may also be present. Similar meanings can be ascribed to the terms "upper" and "lower" (e.g., other layers, films, pads, patterns, or other structures can be between, on, over, or below upper and lower layers). Therefore, the meanings of the terms are determined according to the spirit and scope of embodiments.

The following description of the embodiments of the present invention may not provide detailed description(s) of related and/or known structures or functions. One of ordinary skill in the relevant art may practice the presently disclosed devices and methods without such details.

Embodiments of the present invention include a flash memory device. The flash memory device may include a floating gate and a control gate.

Figure 2:
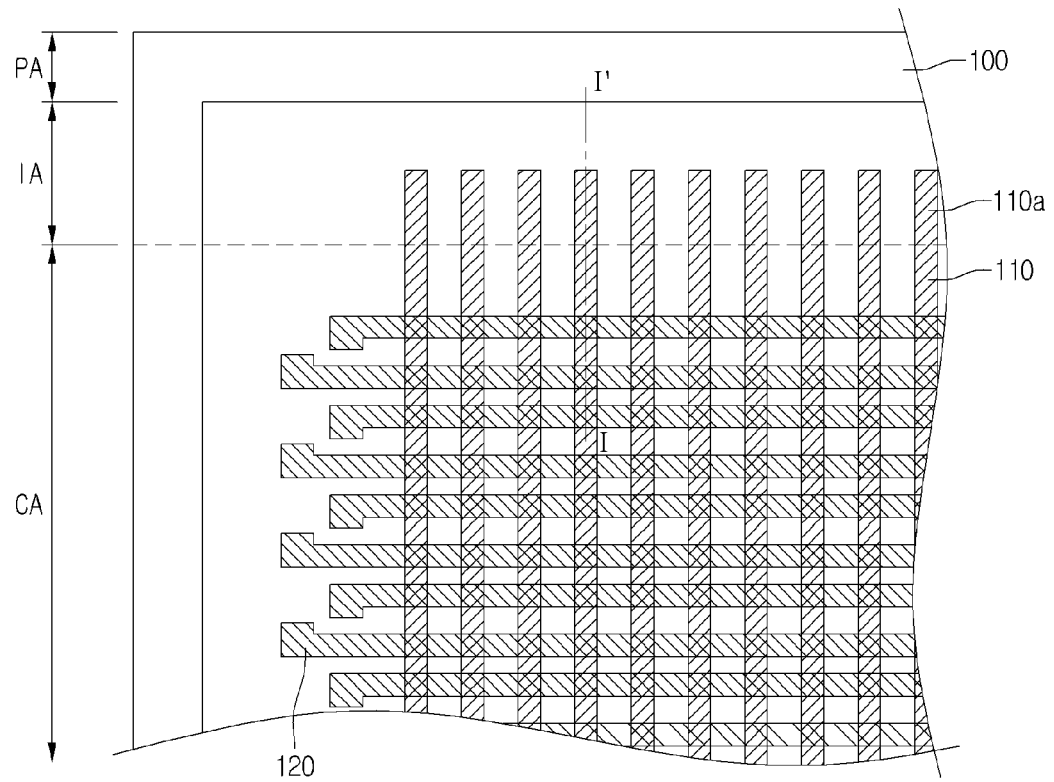
FIG. 2 is a plan view illustrating a part of a semiconductor device according to an embodiment of the present invention.
Figure 3:
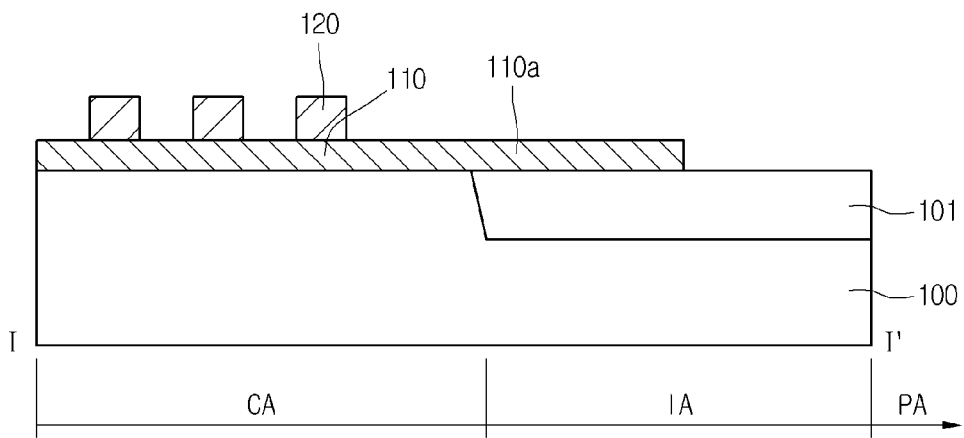
FIG. 3 is a cross-sectional view taken along a line I-I' of FIG. 2.

FIG. 2 is a top-down view illustrating a part of a semiconductor device according to one embodiment. FIG. 3 is a cross-sectional view taken along a line I-I' of FIG. 2.

As illustrated in FIGS. 2 and 3, a cell area CA on which devices are formed, a peripheral area PA around the cell area CA, and an interface area IA between the cell area CA and the peripheral area PA are defined on a semiconductor substrate 100.

A device isolation layer pattern 101 is formed in the semiconductor substrate 100 in order to insulate the devices of the cell area CA and define an active region in the cell area CA below the devices. The device isolation layer pattern 101 may also be formed on the interface area IA of semiconductor substrate 100.

In the cell area CA, a floating gate pattern 110 and a control gate pattern 120 intersect each other to form unit cells, and a dielectric layer (not shown) is between the floating gate pattern 110 and the control gate pattern 120. The dielectric layer may comprise an oxide-nitride-oxide (ONO) layer.

The floating gate pattern 110 formed in the cell area CA may extend to the interface area IA to form a dummy floating gate pattern 110a. The dummy floating gate pattern 110a may extend a predetermined distance into the interface area IA from the cell area CA (e.g., by 0.13 μm to 1.56 μm).

Because the dummy floating gate pattern 110a extends toward the interface area IA to reduce a height difference between the cell area CA and the interface area IA during a process of forming the control gate pattern 120, the CD of the control gate pattern 120 is relatively uniform.

Figure 4:
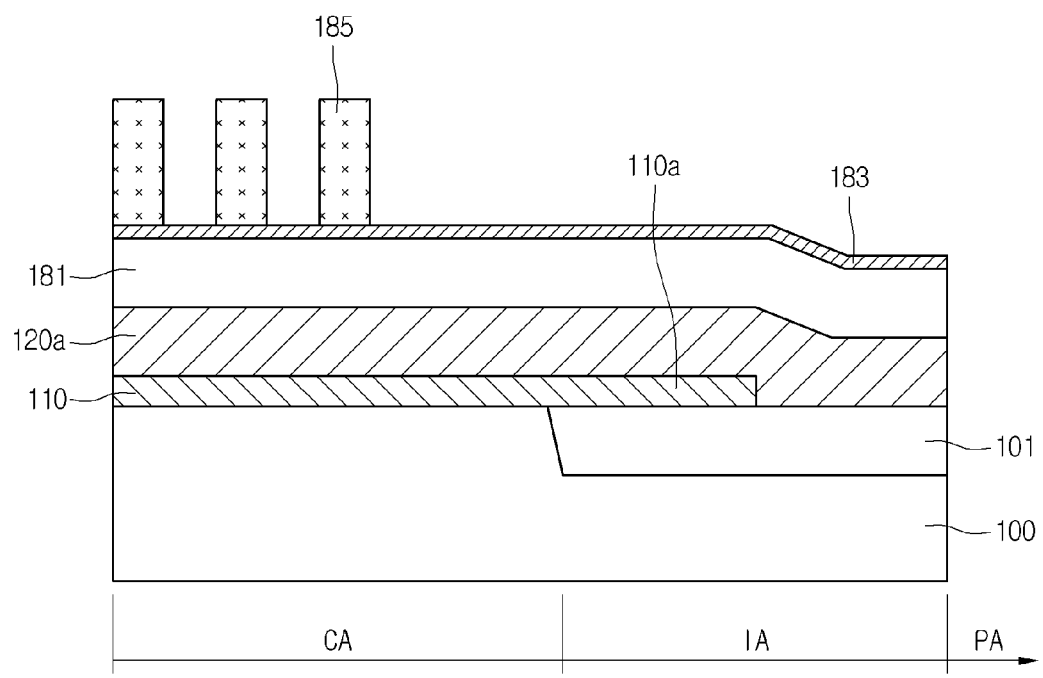
FIG. 4 is a cross-sectional view illustrating a control gate pattern manufacturing process according to an embodiment of the present invention.

FIG. 4 is a cross-sectional view illustrating a control gate pattern manufacturing process among semiconductor device manufacturing processes.

As illustrated in FIG. 4, the floating gate pattern 110 formed in the cell area CA and the dummy floating gate pattern 110a extending from the floating gate pattern 110 into the interface area IA are formed on the semiconductor substrate 100.

The floating gate pattern 110 and the dummy floating gate pattern 110a may have a thickness of about 500 Å to about 2500 Å.

A dielectric layer (e.g., silicon dioxide, silicon nitride, silicon oxynitride, silicon oxide/silicon nitride/silicon oxide [ONO], $AlO_xN_y$, $Al_2O_3$, $Ta_2O_5$, $ZrO_2$, $HfO_2$, $TiO_2$, or BaSr-$TiO_3$) is formed on the floating gate pattern 110 and the dummy floating gate pattern 110a.

A polysilicon layer 120a (for the control gate) is formed on an entire surface of the semiconductor substrate 100 having the floating gate pattern 110 and the dummy floating gate pattern 110a. The polysilicon layer 120a may be deposited on the semiconductor substrate 100 by low pressure chemical vapor deposition (LP-CVD). The polysilicon layer 120a may have a thickness of 500 Å to 2500 Å.

A hard mask layer 181 is formed on the polysilicon layer 120a. The hard mask layer 181 is used to obtain an etching margin and to form the control gate pattern 120 with a fine line width during photolithography.

The hard mask layer 181 may include at least one of a silicon oxide ($SiO_2$) layer, a silicon nitride (SiN) layer, and a silicon oxynitride (SiON) layer. The hard mask layer 181 may have a thickness of 500 Å to 2000 Å.

An anti-reflection layer 183 is formed on the hard mask layer 181. The anti-reflection layer 183 is used for simultaneously increasing light intensity and removing scattered light (which is caused due to reflected light) by reducing surface reflection during photolithography, performed after a photoresist pattern 185 is formed over the anti-reflection layer 183. The anti-reflection layer 183 allows for a smaller and more uniform CD and profile of the photoresist pattern 185.

The anti-reflection layer 183 may have a thickness of 200 Å to 1000 Å. The anti-reflection layer 183 may comprise an organic layer (e.g., a polyethylene oxide) or an inorganic layer (e.g., silicon dioxide, silicon nitride, silicon oxynitride, silicon oxide/silicon nitride/silicon oxide [ONO], $AlO_xN_y$, $Al_2O_3$, $Ta_2O_5$, $ZrO_2$, $HfO_2$, $TiO_2$, or $BaSrTiO_3$).

The anti-reflection layer 183 has a uniform thickness at the edge of the cell area CA. The dummy floating gate pattern 110a extends into the interface area IA such that defective coating that can be caused by a substantial height differential between a cell area and an interface area in a conventional device is reduced or prevented. Even if a thinning phenomenon occurs within the interface area IA, it does not affect the anti-reflection layer 183 in the cell area CA. Therefore, devices having excellent quality can be formed in the cell area CA.

A photoresist layer is formed on the anti-reflection layer 183, selectively exposed to light, and developed in order to form the photoresist pattern 185. The photoresist pattern 185 is formed in the cell area CA, and the thickness of the anti-reflection layer 183 is uniformly formed in the cell area CA. Thus, the CD of the photoresist pattern 185 can be uniform.

Accordingly, when the anti-reflection layer 183, the hard mask layer 181, and the polysilicon layer 120a are etched using the photoresist pattern 185 as a mask, the CD of the control gate pattern 120 becomes uniform such that device performance is improved and reliability can be achieved. Furthermore, wafer yield is increased.

Figure 5:
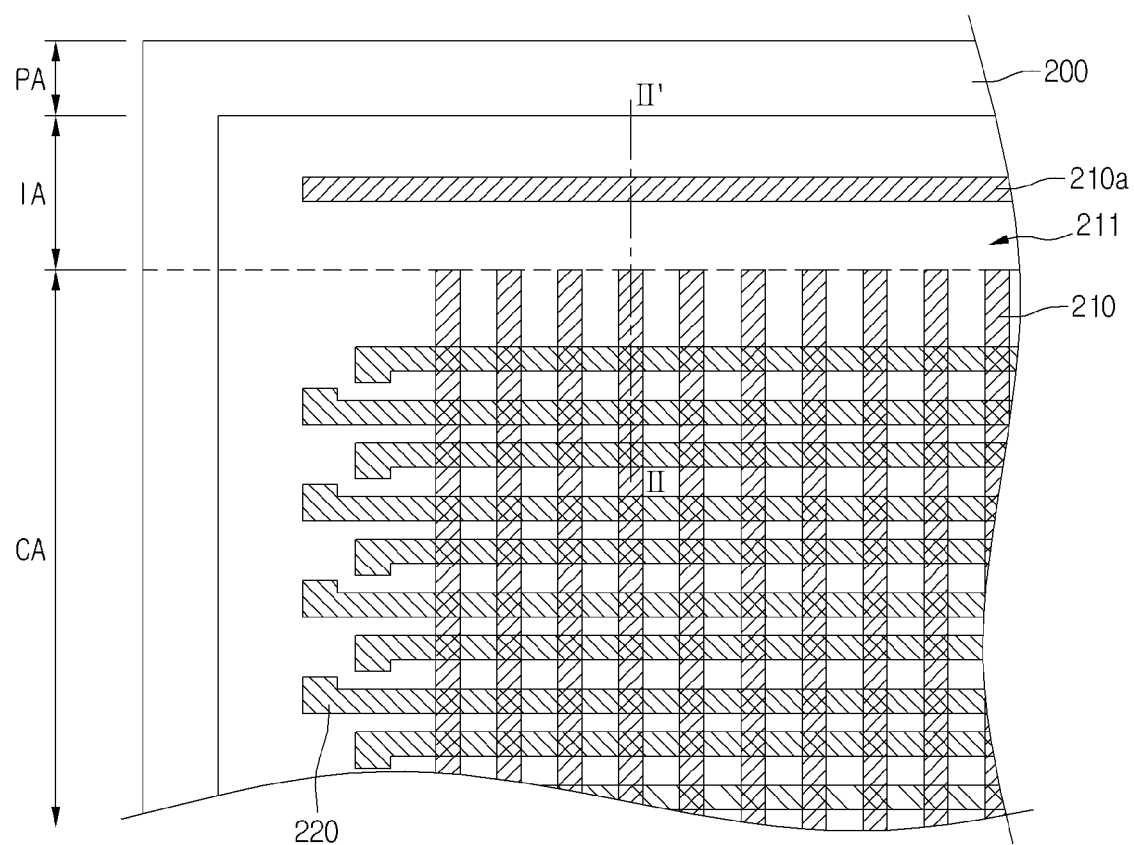
FIG. 5 is a plan view illustrating a part of a semiconductor device according to an embodiment of the present invention.
Figure 6:
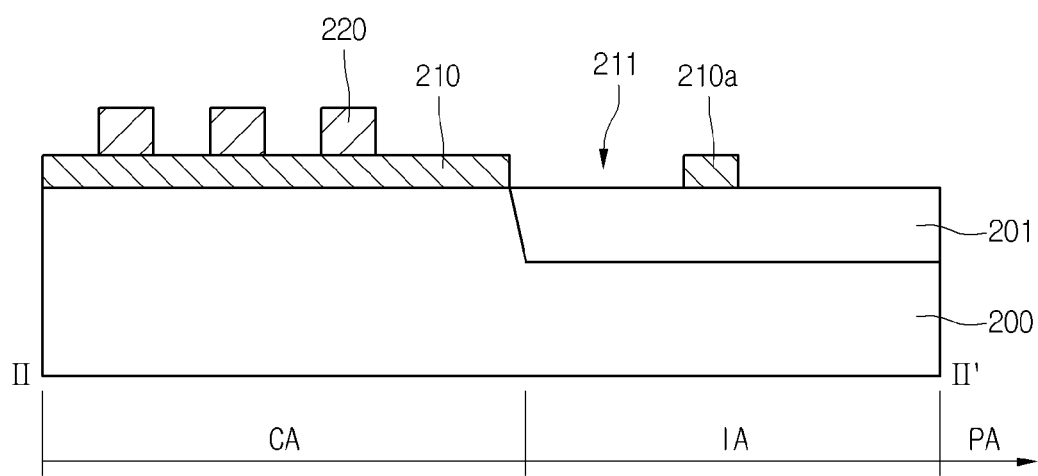
FIG. 6 is a cross-sectional view taken along a line II-II' of FIG. 5.

FIG. 5 is a top-down view illustrating a part of a semiconductor device according to an embodiment of the present invention. FIG. 6 is a cross-sectional view taken along a line II-II' of FIG. 5.

As illustrated in FIGS. 5 and 6, a cell area CA on which devices are formed, a peripheral area PA around the cell area CA, and an interface area IA between the cell area CA and the peripheral area PA are defined on a semiconductor substrate 200.

A device isolation layer pattern 201 is formed in semiconductor substrate 200 in order to insulate the devices of the cell area CA and define an active region below the devices. The device isolation layer pattern 201 may also be formed on the interface area IA of semiconductor substrate 100.

In the cell area CA, a floating gate pattern 210 and a control gate pattern 220 intersect each other to form unit cells, and a dielectric layer (not shown) is between the floating gate pattern 210 and the control gate pattern 220.
The dielectric layer may comprise an oxide-nitride-oxide (ONO) layer.

A dummy floating gate pattern 210a may be formed in the interface area IA in a direction perpendicular to the length direction of the floating gate pattern 210 in the cell area CA. The dummy floating gate pattern 210a may be formed in a parallel direction to the length direction of the control gate pattern 220. The length of the dummy floating gate pattern 210a may be identical to that of the control gate pattern 220.

The dummy floating gate pattern 210a may be spaced apart from the floating gate pattern 210 of the cell area CA, and a spaced area 211 between the dummy floating gate pattern 210a and the floating gate pattern 210 may have a predetermined width (e.g., 0.13 μm to 1.56 μm from a boundary of the cell area CA to the dummy floating gate pattern 210a). The dummy floating gate pattern 210a may also have a predetermined width (e.g., 0.13 μm to 1.56 μm).

Because the dummy floating gate pattern 210a in the interface area IA may be spaced apart from the floating gate pattern 210, an anti-reflection layer 283 can be formed with a uniform thickness during a process of forming the control gate pattern 220. Therefore, the control gate pattern 220 may be formed with a relatively uniform CD.

Figure 7:
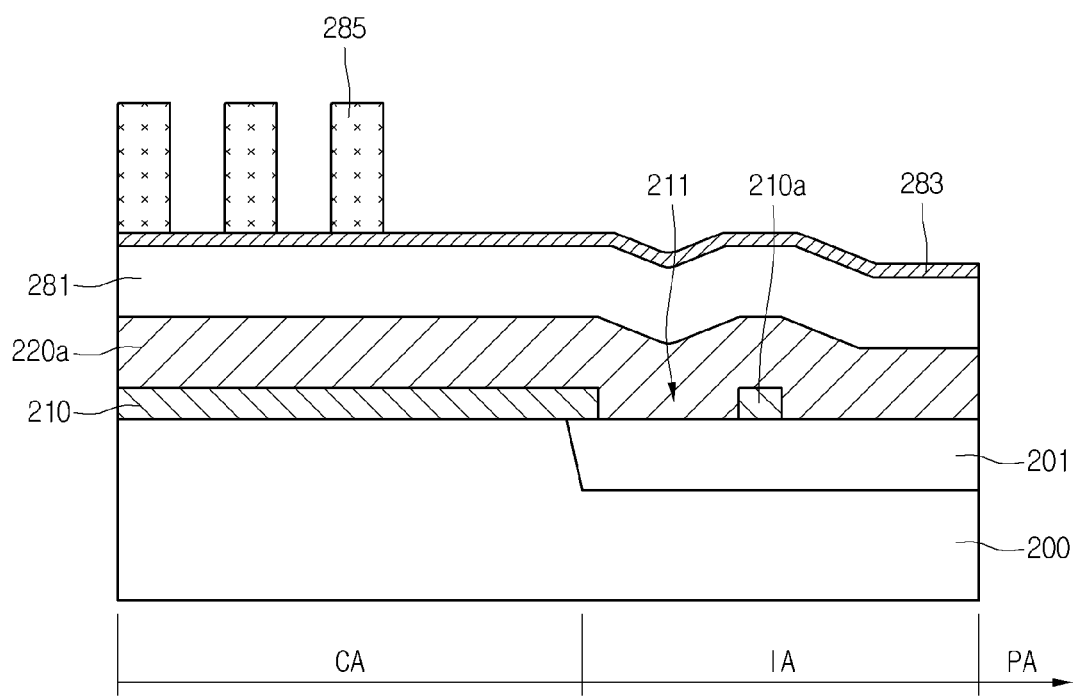
FIG. 7 is a cross-sectional view illustrating a control gate pattern forming process according to an embodiment of the present invention.

FIG. 7 is a cross-sectional view illustrating a control gate pattern forming process. As illustrated in FIG. 7, floating gate patterns 210 are in parallel in a cell area CA of the semiconductor substrate 200.

A dummy floating gate pattern 210a is formed in an interface area IA in a direction perpendicular to a length direction of the floating gate pattern 210. The dummy floating gate pattern 210a may be spaced a predetermined distance apart from the edge of the floating gate pattern 210. A spaced distance between the dummy floating gate pattern 210a and the edge of the floating gate patterns 210 may be 0.13 μm to 1.56 μm. The dummy floating gate pattern 210a may have a predetermined width (e.g., 0.13 μm to 1.56 μm).

Thicknesses of the floating gate pattern 210 and the dummy floating gate pattern 210a may be substantially the same (e.g., about 500 Å to about 2500 Å).

A dielectric layer (e.g., silicon dioxide, silicon nitride, silicon oxynitride, silicon oxide/silicon nitride/silicon oxide [ONO], $AlO_xN_y$, $Al_2O_3$, $Ta_2O_5$, $ZrO_2$, $HfO_2$, $TiO_2$, or $BaSrTiO_3$) is formed on the floating gate pattern 210 and the dummy floating gate pattern 210a.

A polysilicon layer 220a (for the control gate) may be formed on an entire surface of the semiconductor substrate 200 having the floating gate pattern 210 and the dummy floating gate pattern 210a formed thereon. The polysilicon layer 220a is deposited on the semiconductor substrate 100 by LP-CVD. The polysilicon layer 220a may have a thickness of 500 Å to 2500 Å.

The polysilicon layer 220a may have a depressed portion where it is formed over the spaced area 211, between the floating gate patterns 210 and the dummy floating gate pattern 210a.

A hard mask layer 281 is formed on the polysilicon layer 220a. The hard mask layer 281 is used to obtain an etching margin and to form the control gate pattern 220 of FIG. 6 with a fine line width during photolithography.

The hard mask layer 281 may have a depressed portion along the depressed portion of the polysilicon layer 220a between the floating gate patterns 210 and the dummy floating gate pattern 210a.

The hard mask layer 281 may include at least one of a silicon oxide ($SiO_2$) layer, a silicon nitride (SiN) layer, and a silicon oxynitride (SiON) layer. The hard mask layer 281 may have a thickness of 500 Å to 2000 Å.

An anti-reflection layer 283 may be formed on the hard mask layer 281. The anti-reflection layer 283 is used for simultaneously increasing light intensity and removing or reducing scattered light (which is caused due to reflected light) by reducing surface reflection during photolithography, performed after a photoresist pattern 285 may be formed over the anti-reflection layer 283. Thus, the profile of a photoresist pattern 285 formed by exposure and development can be narrower and more uniform.

The anti-reflection layer 283 may have a thickness of 200 Å to 1000 Å. The anti-reflection layer 283 may comprise an organic layer (e.g., a polyethylene oxide) or an inorganic layer (e.g., silicon dioxide, silicon nitride, silicon oxynitride, silicon oxide/silicon nitride/silicon oxide [ONO], $AlO_xN_y$, $Al_2O_3$, $Ta_2O_5$, $ZrO_2$, $HfO_2$, $TiO_2$, or $BaSrTiO_3$). When the anti-reflection layer 283 is an organic layer, an organic material is coated on the hard mask layer by a spin coating method.

Because of a height difference caused by the spaced area 211 between the floating gate patterns 210 and the dummy floating gate pattern 210a, when a material of the anti-reflection layer 283 is coated, the material flows into the curved portion and thus serves as a filler to prevent the thickness of the anti-reflection layer 283 from changing at the edge of the cell area CA.

Due to the above structure, the anti-reflection layer 283 is formed with a relatively uniform thickness at the edge of the cell area CA. Accordingly, high quality devices can be formed in the cell area CA.

A photoresist layer is formed on the anti-reflection layer 283, selectively exposed to light, and developed in order to form the photoresist pattern 285. The photoresist pattern 285 is formed in the cell area CA, and the thickness of the anti-reflection layer 283 is relatively uniform in the cell area CA. Thus, the CD of the photoresist pattern 285 can be uniform.

Accordingly, when the anti-reflection layer 283, the hard mask layer 281, and the polysilicon layer 220a are etched using the photoresist pattern 285 as a mask, the CD of the control gate pattern 220 can be relatively uniform such that device performance is improved and reliability can be achieved. Furthermore, wafer yield is increased.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor device comprising:
   a trench having a predetermined depth in a semiconductor substrate, in a cell area of a semiconductor substrate and an interface area of the semiconductor substrate around the cell area
   a device isolation layer pattern in the trench;
   a floating gate pattern in the cell area of the semiconductor substrate;
   a dummy floating gate pattern that extends from the floating gate pattern into the interface area around the cell area; and
   a control gate pattern intersecting the floating gate pattern in the cell area of the semiconductor substrate.

2. The semiconductor device according to claim 1, wherein the dummy floating gate pattern extends from a boundary of the cell area by 0.13 μm to 1.56 μm.

3. The semiconductor device according to claim 1, wherein the dummy floating gate pattern is on the device isolation layer pattern.

4. The semiconductor device according to claim 1, further comprising a dielectric layer on the floating gate pattern and the dummy floating gate pattern.

5. The semiconductor device according to claim 1, wherein the floating gate pattern and the dummy floating gate pattern are part of a same layer.

6. The semiconductor device according to claim 1, wherein the dummy floating gate pattern has a same length as the control gate pattern.

7. A method of fabricating a semiconductor device, the method comprising:
   forming a trench having a predetermined depth in a cell area of a semiconductor substrate and an interface area of the semiconductor substrate around the cell area;
   forming a device isolation layer in the trench;
   forming a floating gate pattern in the cell area of the semiconductor substrate;
   forming a dummy floating gate pattern, the dummy floating gate pattern extending from the floating gate pattern to an interface area around the cell area; and
   forming a control gate pattern in the cell area of the semiconductor substrate, the control gate pattern intersecting the floating gate pattern.

8. The method according to claim 7, wherein the forming of the control gate pattern comprises:
   sequentially forming a polysilicon layer, an anti-reflection layer, and a photoresist layer over the semiconductor substrate having the floating gate pattern and the dummy floating gate pattern; and
   selectively exposing and then developing the photoresist layer to form a photoresist pattern and patterning the anti-reflection layer and the polysilicon layer using the photoresist pattern as a mask.

9. The method according to claim 8, wherein forming the anti-reflection layer comprises a spin-coating method.

10. The method according to claim 7, wherein forming the dummy floating gate pattern and the floating gate pattern comprises depositing and patterning a same layer, and the dummy floating gate pattern comprises a portion of the patterned single layer that extends from a boundary of the cell area into the interface area by about 0.13 μm to 1.56 μm.

11. The method according to claim 7, further comprising forming a dielectric layer on the dummy floating gate pattern and the floating gate pattern.

12. The method according to claim 7, wherein a width of the dummy floating gate pattern ranges from about 0.13 μm to about 1.56 μm.

13. A semiconductor device comprising:
   a trench having a predetermined depth in a cell area of a semiconductor substrate and in an interface area of the semiconductor substrate around the cell area;
   a device isolation layer pattern in the trench;
   floating gate patterns elongated in a first direction in the cell area of the semiconductor substrate;
   a control gate pattern intersecting the floating gate patterns in the cell area of the semiconductor substrate in a second direction perpendicular to the first direction; and
   a dummy floating gate pattern on the interface area in the second direction and spaced apart from one end of the floating gate pattern.

14. The semiconductor device according to claim 13, wherein the dummy floating gate pattern has a same length as the control gate pattern.

15. The semiconductor device according to claim 13, wherein a spaced distance between the floating gate pattern and the dummy floating gate pattern ranges from about 0.13 μm to about 1.56 μm.

16. The semiconductor device according to claim 13, wherein a line width of the dummy floating gate pattern ranges from about 0.13 μm to about 1.56 μm.

17. A method of manufacturing a semiconductor device, the method comprising:
   forming a trench having a predetermined depth in a cell area of a semiconductor substrate and an interface area of the semiconductor substrate around the cell area;
   forming a device isolation layer in the trench;
   forming floating gate patterns in the cell area of the semiconductor substrate;

forming dummy floating gate patterns in the interface area, the dummy floating gate patterns being spaced apart in a direction perpendicular to a length direction of the floating gate patterns; and forming a control gate pattern in the cell area of the semiconductor substrate, the control gate pattern intersecting the floating gate pattern.

18. The method according to claim 17, wherein the forming of the control gate pattern comprises:

sequentially forming a polysilicon layer, an anti-reflection layer, and a photoresist layer on an entire surface of the semiconductor substrate having the floating gate pattern and the dummy floating gate pattern; and selectively exposing and then developing the photoresist layer to form a photoresist pattern and patterning the anti-reflection layer and the polysilicon layer using the photoresist pattern as a mask.

19. The method according to claim 18, wherein forming the anti-reflection layer comprises a spin-coating method.

20. The method according to claim 17, wherein forming the dummy floating gate patterns and the floating gate patterns comprises depositing and patterning a same layer, and the dummy floating gate patterns comprise a portion of the patterned single layer that extends from a boundary of the cell area into the interface area by about 0.13 μm to 1.56 μm.

* * * * *